US006862655B1

(12) United States Patent
Podaima et al.

(10) Patent No.: US 6,862,655 B1
(45) Date of Patent: Mar. 1, 2005

(54) WIDE WORD SEARCH USING SERIAL MATCH LINE COMPUTATION IN CONTENT ADDRESSABLE MEMORY

(75) Inventors: Jason Edward Podaima, Kanata (CA); Sanjay Gupta, Nepean (CA); G. F. Randall Gibson, Nepean (CA); Radu Avramescu, Nepean (CA)

(73) Assignee: SiberCore Technologies, Inc. (CA)

( * ) Notice: Subject to any disclaimer, the term of this patent is extended or adjusted under 35 U.S.C. 154(b) by 323 days.

(21) Appl. No.: 10/263,112

(22) Filed: Oct. 1, 2002

(51) Int. Cl.[7] .............................................. G06F 12/00
(52) U.S. Cl. ....................... 711/108; 365/49; 711/217
(58) Field of Search ................................ 711/108, 217, 711/201; 365/49, 392, 596

(56) References Cited

U.S. PATENT DOCUMENTS 5,179,640 A * 1/1993 Duffy .......................... 345/596
6,674,660 B2 * 1/2004 Shau ............................ 365/49
2003/0231630 A1 * 12/2003 Messenger ................... 370/392
2004/0093462 A1 * 5/2004 Roth et al. ................... 711/108

* cited by examiner

Primary Examiner—Pierre Bataille
(74) Attorney, Agent, or Firm—Martine & Penilla, LLP

(57) ABSTRACT

A content addressable memory (CAM) is provided that can perform wide word searches. At least one CAM memory core having a plurality of bit pattern entry rows is included in the CAM. In addition, search logic is included that, is capable searching particular rows during each cycle. The search logic is also capable of allowing match line results of unsearched rows to remain unchanged during a cycle. The CAM further includes a serial AND array in communication with the bit pattern entry rows, wherein the serial AND array is capable of computing a match result for wide word entries that span multiple bit pattern entry rows. In one aspect, a match line enable signal is provided to the serial AND array, which facilitates computation of the match result.

27 Claims, 13 Drawing Sheets

500 → 208 218

| BIT PATTERN ROW | WORD BOUNDARY BIT VALUE |
|---|---|
| ROW 0 | 1 |
| ROW 1 | 1 |
| ROW 2 | 1 |
| ROW 3 | 1 |

| BIT PATTERN ROW | WORD BOUNDARY BIT VALUE |
|---|---|
| 208a → ROW 0 | 1 |
| 208b → ROW 1 | 0 |
| 208c → ROW 2 | 1 |
| 208d → ROW 3 | 0 |

FIG. 5B

WIDE WORD SEARCH USING SERIAL MATCH LINE COMPUTATION IN CONTENT ADDRESSABLE MEMORY

CROSS REFERENCE TO RELATED APPLICATIONS

This application is related to the following applications: (1) U.S. patent application Ser. No. 09/654,316, filed Sep. 1, 2000, and entitled "Variable Width Content Addressable Memory Device For Searching Variable Width Data"; and (2) U.S. patent application Ser. No. 09/642,253, filed Aug. 17, 2000, and entitled "Priority Encoder With Multiple Match Function For Content Addressable Memories And Methods For Making The Same." Each of these related application is incorporated herein by reference.

BACKGROUND OF THE INVENTION

1. Field of the Invention

The present invention relates generally to memory devices, and more particularly to content addressable memory devices searchable using words spanning multiple rows in memory.

2. Description of the Related Art

Memory devices are indispensable components of modern computer systems and networks. As storage devices, they are used to provide fast access to data and instructions stored therein. A content addressable memory (CAM) is a special type of memory that is often used for performing address searches. For example, Internet routers often include a CAM for searching the address of specified data. The use of CAMs allows the routers to perform fast searches to allow computer systems to communicate data with one another over networks. In addition, CAMs are utilized in numerous other areas such as database searches, image processing, and voice recognition applications, where fast search performance is desired.

As is well known, CAMs typically include a two-dimensional row and column content address memory array of core cells, such that each row contains an address, pointer, or bit pattern entry. Within such an array of cells, a CAM may perform "read "and "write" operations at specific addresses like a conventional random access memory (RAM). In addition, a CAM is used to perform fast search operations that simultaneously compare a bit pattern of data, known as a comparand, against an entire list (e.g., column) of pre-stored entries (e.g., rows) of bit patterns in the CAM array. Based on these comparisons, the CAM typically outputs a result in the form of an address, pointer, or bit pattern corresponding to an entry that matches the input data. By thus performing comparisons simultaneously of all CAM entries, the CAM provides significant savings in search time over RAMs such as DRAMs, SRAMs, and the like.

A CAM typically can perform high-speed searches on comparands or search keys of a particular bit length, known as the word width. However, available word widths in conventional CAMs are limited by the physical organization of the CAM. FIG. 1 is a logical diagram showing a conventional CAM array 100. The CAM array 100 comprises a plurality of bit pattern entries 102, each comprising a plurality of CAM cells 104 coupled to a match line 106. In use, each CAM cell 104 stores a bit of the bit pattern entry 102, while the match line 106 is used to indicate the match results of search operations.

During a search operation, a comparand is compared against each bit pattern entry 102 in the CAM array 100 by comparing the individual bits of the comparand against the corresponding CAM cell 104 of the bit pattern entry 102. If each CAM cell 104 of the bit pattern entry 102 matches the corresponding bit of the comparand, the match line 106 of the bit pattern entry is high. However, CAM cells 104 that do not match the comparand ground the match line 106, thus pulling the match line 106 for the bit pattern entry 102 low when the comparand does not match the data stored in the bit pattern entry 102.

As can be seen from FIG. 1, the word width usable in a conventional CAM is limited by the actual physical dimensions of the CAM array 100. In particular, a conventional CAM requires each word, or bit pattern entry 102, to be organized such that the entire word occupies a row of the CAM array 100 along a match line 106. Unfortunately, this physical restriction limits the word width available when using conventional CAMs.

More particularly, a CAM chip must fit within a package, which implies physical limitations on the actual dimensions of the CAM memory. Generally, CAM memories can only be built to a particular size before 1) performance degrades and 2) the chip no longer fits within the packaging. Performance degradation often results from extra loading caused from using long match lines, which are conventionally needed when using extended word widths.

In view of the foregoing, there is a need for CAM architectures wherein the word width is not limited by the physical width of the CAM memory. In particular, the CAM architectures should allow for word width sizes greater than the width of a single CAM row, thereby maximizing the usage of CAM space with attendant savings in cost.

SUMMARY OF THE INVENTION

Broadly speaking, the present invention fills these needs by providing a CAM architecture capable of performing wide word searches for words spanning multiple CAM rows. In one embodiment, a CAM capable of performing wide word searches is disclosed. The CAM includes at least one CAM memory core having a plurality of bit pattern entry rows, and a boundary array having a plurality of word boundary bits, wherein each word boundary bit corresponds to a bit pattern entry row. Also included is a serial AND array that is in communication with the bit pattern entry rows and the word boundary bits. The serial AND array is capable of utilizing the word boundary bits to compute a match result for wide word entries that span multiple bit pattern entry rows. Specific word boundary bits can indicate word boundaries of stored word entries. Word boundary bits having a value of "1" can indicate a beginning of a new word entry, or optionally, an end of a word entry spanning multiple bit pattern entry rows.

In another embodiment, a CAM capable of performing wide word searches is disclosed that includes a boundary array having a plurality of word boundary bits, wherein each word boundary bit corresponds to a bit pattern entry row of a CAM memory core. In addition, a serial AND array having a plurality of serial AND computational units is included. In this embodiment, each serial AND computational unit is in communication with a corresponding bit pattern entry row of the CAM memory core and a word boundary bit corresponding to the bit pattern entry row. Further, serial AND computational units receive as inputs a word boundary bit and an internal match line result corresponding to an adjacent bit pattern entry row. In this manner, the serial AND array is capable of utilizing the word boundary bits to compute a match result for wide word entries that span multiple bit pattern entry rows. Using this embodiment, word boundary bits having a value of "1" can indicate a beginning of a new word entry. The internal match line result for a particular serial AND computational unit can be a match line result before processing the word boundary bit corresponding the serial AND computational unit. In one aspect, a bit pattern entry row having a highest address of the bit pattern entry rows comprising a word entry can be searched before remaining bit pattern entry rows of the word entry. Similarly, a bit pattern entry row having a lowest address of the bit pattern entry rows comprising the word entry can be searched after other bit pattern entry rows of the word entry.

A further CAM capable of performing wide word searches is disclosed in a further embodiment of the present invention. The CAM includes a boundary array having a plurality word boundary bits, wherein each word boundary bit corresponds to a bit pattern entry row of a CAM memory core. In addition, the CAM includes a serial AND array having a plurality of serial AND computational units, wherein each serial AND computational unit is in communication with a corresponding bit pattern entry row of the CAM memory core and a word boundary bit corresponding to the bit pattern entry row. In this embodiment, serial AND computational units receive as inputs a control signal indicating a beginning of a search and a control signal indicating an end of a search. In this manner, the serial AND array is capable of utilizing the word boundary bits to compute a match result for wide word entries that span multiple bit pattern entry rows. Optionally, serial AND computational units can further receive as an input a match result from an adjacent serial AND computational unit. Generally, in this embodiment, word boundary bits having a value of "1" can indicate an end of a word entry spanning multiple bit pattern entry rows.

Yet a further CAM capable of performing wide word searches is disclosed in an additional embodiment of the present invention. At least one CAM memory core having a plurality of bit pattern entry rows is included in the CAM. In addition, search logic is included that is capable of searching particular rows during each cycle. The search logic is also capable of allowing match line results of unsearched rows to remain unchanged during a cycle. The CAM further includes a serial AND array in communication with the bit pattern entry rows, wherein the serial AND array is capable of computing a match result for wide word entries that span multiple bit pattern entry rows.

In one aspect, a match line enable signal, which facilitates computation of the match result, is provided to the serial AND array. Optionally, the serial AND array can include a plurality of serial AND computational units, wherein each serial AND computational unit is in electrical communication with a bit pattern entry row and the match line enable signal. In addition, each serial AND computational unit can receive both a match line from the corresponding bit pattern entry row and the match line enable signal. As above, the CAM can further include a plurality of CAM memory cores serially coupled, and be capable of storing word entries spanning multiple CAM memory cores.

Advantageously, the embodiments of the present invention can perform searches for wide word entries spanning multiple bit pattern entry rows without altering the physical width of CAM memory. Thus, adverse consequences, such as reduced efficiency and increased cost, associated with physically wide CAM memory are avoided using the embodiments of the present invention. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which:

FIG. 5A is a chart showing word boundary bit values for four word entries each comprising a single bit pattern row, in accordance with an embodiment of the present invention;

FIG. 5B is a chart showing word boundary bit values for two word entries each comprising two bit pattern rows, in accordance with an embodiment of the present invention;

DETAILED DESCRIPTION OF THE PREFERRED EMBODIMENTS

An invention is disclosed for a wide word CAM system that allows CAM entries to occupy multiple physical rows of a CAM. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1:
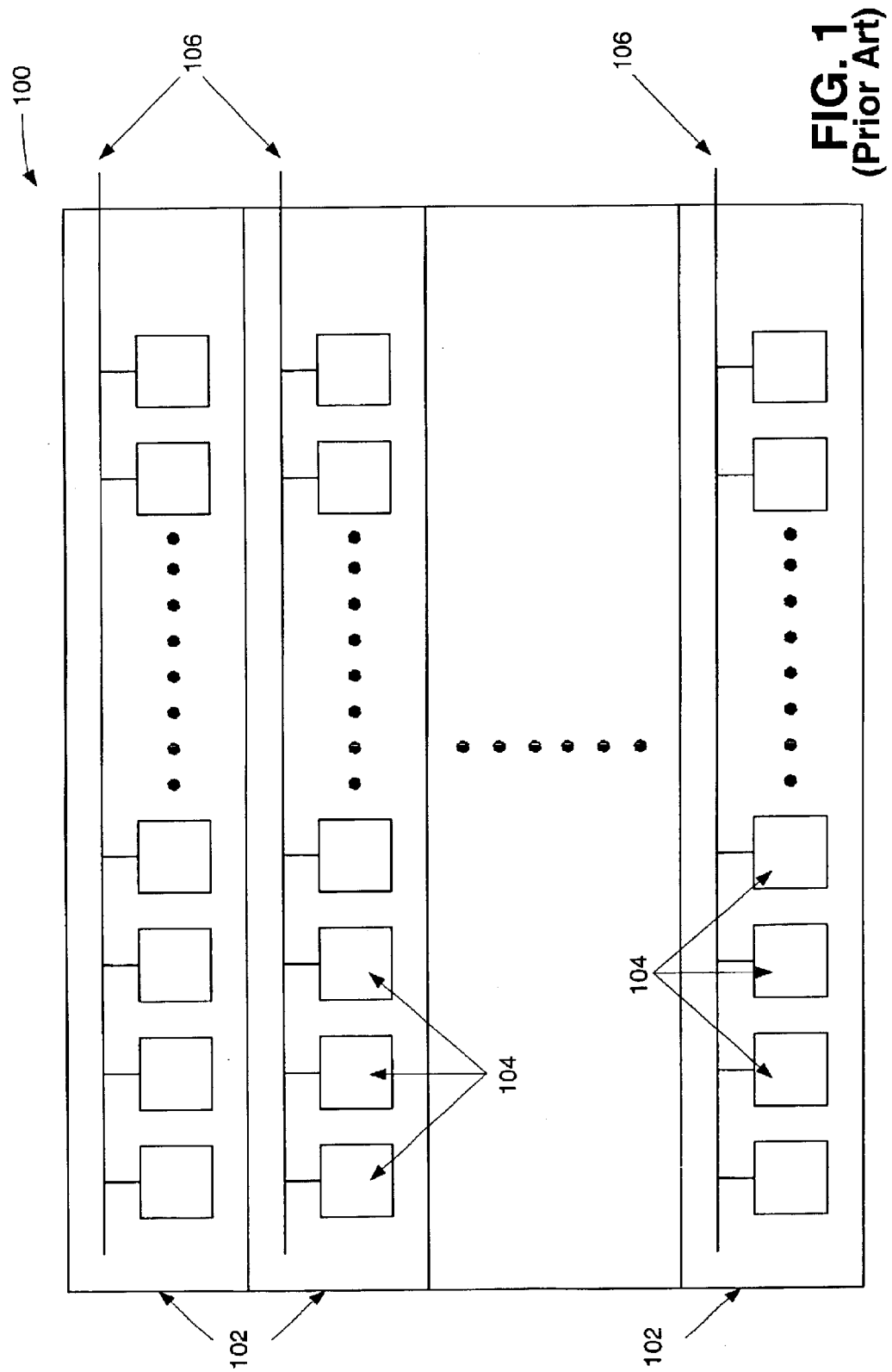
FIG. 1 is a logical diagram showing a conventional CAM array.
Figure 2:
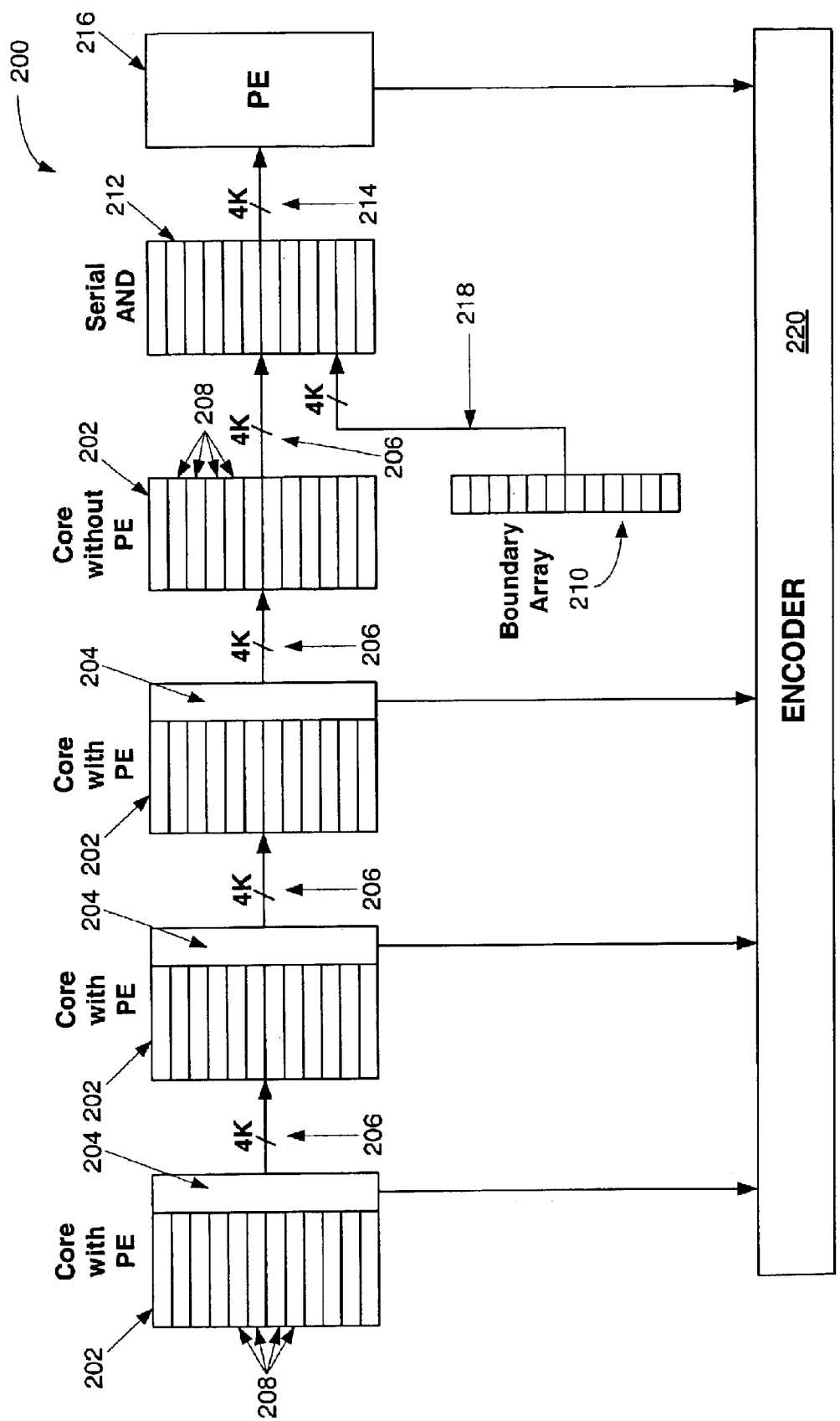
FIG. 2 is a block diagram showing a wide word CAM system, in accordance with an embodiment of the present invention.

FIG. 1 was described in terms of the prior art. FIG. 2 is a block diagram showing a wide word CAM system 200, in accordance with an embodiment of the present invention. The wide word CAM system 200 includes a plurality of CAM cores 202 having local priority encoders 204, which are each further coupled to a main priority encoder 220. Each CAM core 202 includes a plurality of bit pattern entry rows 208, which are used to store the data for the CAM. In the example of FIG. 2, each CAM core 202 includes 4K bit pattern rows 208, however, it should be noted that any number of bit pattern rows 208 may be included in the CAM cores depending on the CAM design and needs of the user.

In addition, the CAM system 200 includes a CAM core 202, which does not include priority encoder. Although the wide word CAM system 200 is illustrated in FIG. 2 having four CAM cores, it should be noted that any number of CAM cores can be included in the wide word CAM system 200 using the embodiments of the present invention.

Each CAM core 202 is coupled to the next CAM core 202 via match lines 206. As above, although FIG. 2 shows 4K of match lines 206, it should be borne in mind that any number of match lines 206 can be utilized depending on the CAM core design and the needs of the user. Using tag bits, which define the width of a word, bit pattern entries of variable widths can be implemented utilizing the CAM system 200. In particular, a word can be stored across multiple CAM cores 202 by providing the match lines 206 to adjacent CAM cores 202 storing a single word.

In one embodiment of the present invention, unique width tags are used as part of each CAM entry to indicate the width of the entry. A unique tag value is associated with each CAM entry and denotes the entry width size. For example, Table 1 below shows four distinct word sizes, which can be implemented using two bit tag values. It should be noted that additional CAM entry sizes can be supported by ensuring that each tag value is uniquely encoded with the appropriate and similar number of bits.

TABLE 1

| Tag Value | CAM Entry Size |
|---|---|
| A | 1 row word |
| B | 2 row word |
| C | 3 row word |
| D | 4 row word |

For example, in Table 1, tag value "A" could be represented by bits "00," tag value "B" by bits "01," tag value "C" by bits "10," and tag value "D" by bits "11." These tag values would then be associated with CAM entries to denote the entry width size.

In order to perform the wide word searches described subsequently, embodiments of the present invention store wide words in a particular fashion. Tables 2–7 below illustrate exemplary wide word storage configurations for performing wide words searches, in accordance with an embodiment of the present invention. In the following examples, T refers to a "Tail" logic value and NT refers to a "Non-tail" logic value. Although the various Figures of the present disclosure will be described in terms of T=1 and NT=0, it should be borne in mind that embodiments of the present invention can be implemented using other logic values by making appropriate modifications to the circuitry of FIGS. 3 and 6. In addition, it should be noted that ternary data can be used in the embodiments of the present invention.

Table 2 below shows unique width tags associated with four single row stored CAM entries for use in an ascending search.

TABLE 2

| Row | Stored Tag | Stored Data | Boundary Bit |
|---|---|---|---|
| 0 | A | DataA1-A | T |
| 1 | A | DataA1-B | T |
| 2 | A | DataA1-C | T |
| 3 | A | DataA1-D | T |

Table 3 below shows unique width tags associated with four single row stored CAM entries for use in a descending search.

TABLE 3

| Row | Stored Tag | Stored Data | Boundary Bit |
|---|---|---|---|
| 0 | A | DataA1-A | T |
| 1 | A | DataA1-B | T |
| 2 | A | DataA1-C | T |
| 3 | A | DataA1-D | T |

Table 4 below shows unique width tags associated with two double row stored CAM entries for use in an ascending search.

TABLE 4

| Row | Stored Tag | Stored Data | Boundary Bit |
|---|---|---|---|
| 0 | B | DataB1-E | NT |
| 1 | B | DataB2-E | T |
| 2 | B | DataB1-F | NT |
| 3 | B | DataB2-F | T |

Table 5 below shows unique width tags associated with two double row stored CAM entries for use in a descending search.

TABLE 5

| Row | Stored Tag | Stored Data | Boundary Bit |
|---|---|---|---|
| 0 | B | DataB1-E | T |
| 1 | B | DataB2-E | NT |
| 2 | B | DataB1-F | T |
| 3 | B | DataB2-F | NT |

Table 6 below shows unique width tags associated with a four row stored CAM entry for use in an ascending search.

TABLE 6

| Row | Stored Tag | Stored Data | Boundary Bit |
|---|---|---|---|
| 0 | D | DataD1-G | NT |
| 1 | D | DataD2-G | NT |
| 2 | D | DataD3-G | NT |
| 3 | D | DataD4-G | T |

Table 7 below shows unique width tags associated with a four row stored CAM entry for use in a descending search.

TABLE 7

| Row | Stored Tag | Stored Data | Boundary Bit |
| --- | --- | --- | --- |
| 0 | D | DataD1-G | T |
| 1 | D | DataD2-G | NT |
| 2 | D | DataD3-G | NT |
| 3 | D | DataD4-G | NT |

Table 8 below shows unique width tags associated with a four row stored CAM entry and a double row stored CAM entry for use in an ascending search.

TABLE 8

| Row | Stored Tag | Stored Data | Boundary Bit |
| --- | --- | --- | --- |
| 0 | D | DataD1-G | NT |
| 1 | D | DataD2-G | NT |
| 2 | D | DataD3-G | NT |
| 3 | D | DataD4-G | T |
| 4 | B | DataB1-H | NT |
| 5 | B | DataB2-H | T |

Table 9 below shows unique width tags associated with a four row stored CAM entry and a double row stored CAM entry for use in a descending search.

TABLE 9

| Row | Stored Tag | Stored Data | Boundary Bit |
| --- | --- | --- | --- |
| 0 | D | DataD1-G | T |
| 1 | D | DataD2-G | NT |
| 2 | D | DataD3-G | NT |
| 3 | D | DataD4-G | NT |
| 4 | B | DataB1-H | T |
| 5 | B | DataB2-H | NT |

Further discussion regarding variable width words can be found in U.S. patent application Ser. No. 09/654,316, filed Sep. 1, 2000, and entitled "Variable Width Content Addressable Memory Device For Searching Variable Width Data," which is incorporated herein by reference.

The wide word CAM system 200 further includes a serial AND array 212. The serial AND array 212 receives as inputs the match line outputs 206 of the CAM core 202, which does not include a priority encoder, and word boundary bits 218 from a boundary bit array 210. The serial AND array 212, in conjunction with the boundary array 210, allows embodiments of the present invention to perform search operations using words spanning multiple bit pattern rows 208, in addition to variable word widths as described above. More particularly, the boundary array 210 is an array of word boundary bits 218, each storing either a "1" or "0" and corresponding to the bit pattern entry rows 208 of the CAM cores 202. For example, the boundary array 210 of FIG. 2 can be a 4K SRAM table having 4K word boundary bits 218 each holding a "1" or a "0."

In the embodiments of the present invention, each word boundary bit 218 indicates either the start or end, depending on the embodiment, of a word boundary within the CAM. More particularly, each word boundary bit 218 of the boundary array 210 corresponds to a match line 206 and indicates either the start of a word boundary, or the end of a word boundary. For example, in one embodiment, a word boundary bit 218 with a value of "1" indicates the start of a new word. In this embodiment, if a word spans multiple bit pattern rows 208, the word boundary bit 218 corresponding to the bit pattern row 208 having the lowest address in the CAM cores 202 has a value of "1." The word boundary bits 218 of subsequent bit pattern rows 208 corresponding to the remainder of the word have a value of "0."

The serial AND array 212 combines the match lines 206 of word entries that span multiple bit pattern rows 208 and synthesizes a match line result 214 that resembles a solution that would occur had there been a very large word comprising a single bit pattern row. Specifically, the serial AND array 212 comprises a plurality of serial AND computational units, which use the match lines 206 and the word boundary bits 210 as inputs to compute a match line result 214 for each word entry regardless of how many bit pattern rows 208 the word entry spans. The match line results 214 from the serial AND array 212 are provided to the priority encoder 216, which generates the highest priority matching address.

Figure 3:
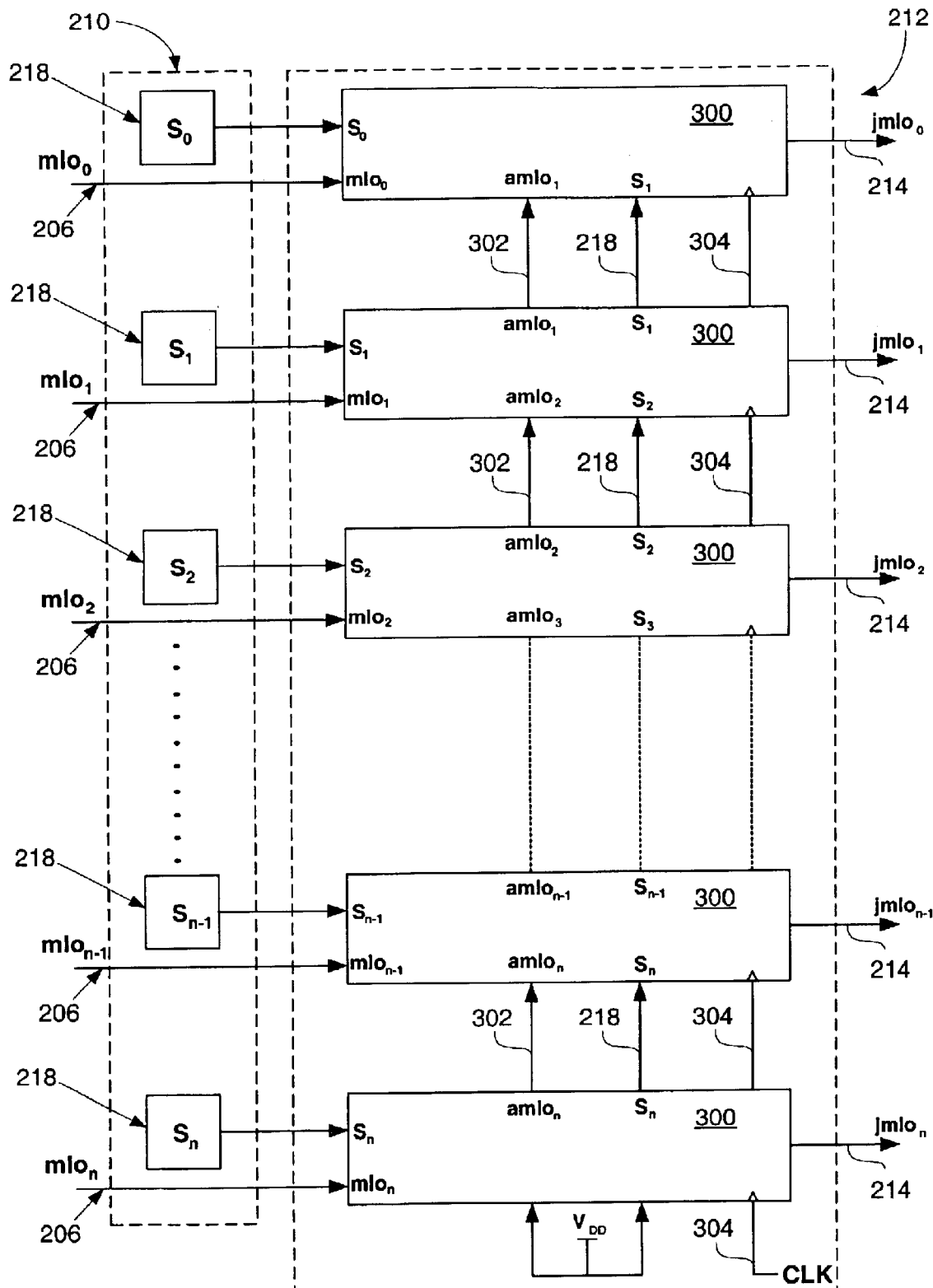
FIG. 3 is a schematic block diagram showing a serial AND array, in accordance with an embodiment of the present invention.

FIG. 3 is a schematic block diagram showing a serial AND array 212, in accordance with an embodiment of the present invention. The serial AND array 212 includes a plurality of serial AND computational units 300, which receive as inputs word boundary bits 218 from the boundary array 210 and match lines 206 from the CAM cores. In addition, each serial AND computational unit 300 receives an internal match line result 302 from an adjacent serial AND computational unit 300, and the word boundary bit 218 from the adjacent serial AND computational unit 300. To ensure operability, the last serial AND computational unit 300, coupled to the bit pattern entry having the highest address, is attached to a voltage source, as shown in FIG. 3. Further, a common clock signal: 304 is provided to each serial AND computational unit 300.

In operation, the serial AND computational units 300 synthesize a match line result 214 that resembles a solution that would occur had there been a very large word comprising a single bit pattern row. More particularly, the serial AND computational units 300 combine the match lines 206 from bit pattern rows comprising a single word entry, and output the match line result 214 from the serial AND computational unit 300 corresponding the bit pattern row of the word entry having the lowest memory address. The match line results 214 corresponding to the bit pattern rows of the remainder of the word entry are forced to a miss or "0."

The serial AND array 212 shown in FIG. 3 illustrates an example of a descending search configuration. That is, the shift chain indicated by the internal match line result 302 is configured to shift from row n to row 0. As a result, search data is sequenced in time to match data in progressively lower (row i−1) addresses. However, it should be noted that an ascending search configuration can be utilized wherein the shift chain indicated by the internal match line result 302 is configured to shift from row 0 to row n. An ascending search configuration feeds the internal match line result 302 to the serial AND computational unit 300 next higher (row i+1) location.

To facilitate match line 206 combining, each serial AND computational unit 300 receives the internal match line result 302 from an adjacent serial AND computational unit 300. Each internal match line result 302 is based on the match line 206 of the corresponding bit pattern row and the match line or word boundary bit 218 of an adjacent bit pattern row, as described in greater detail below.

Figure 4:
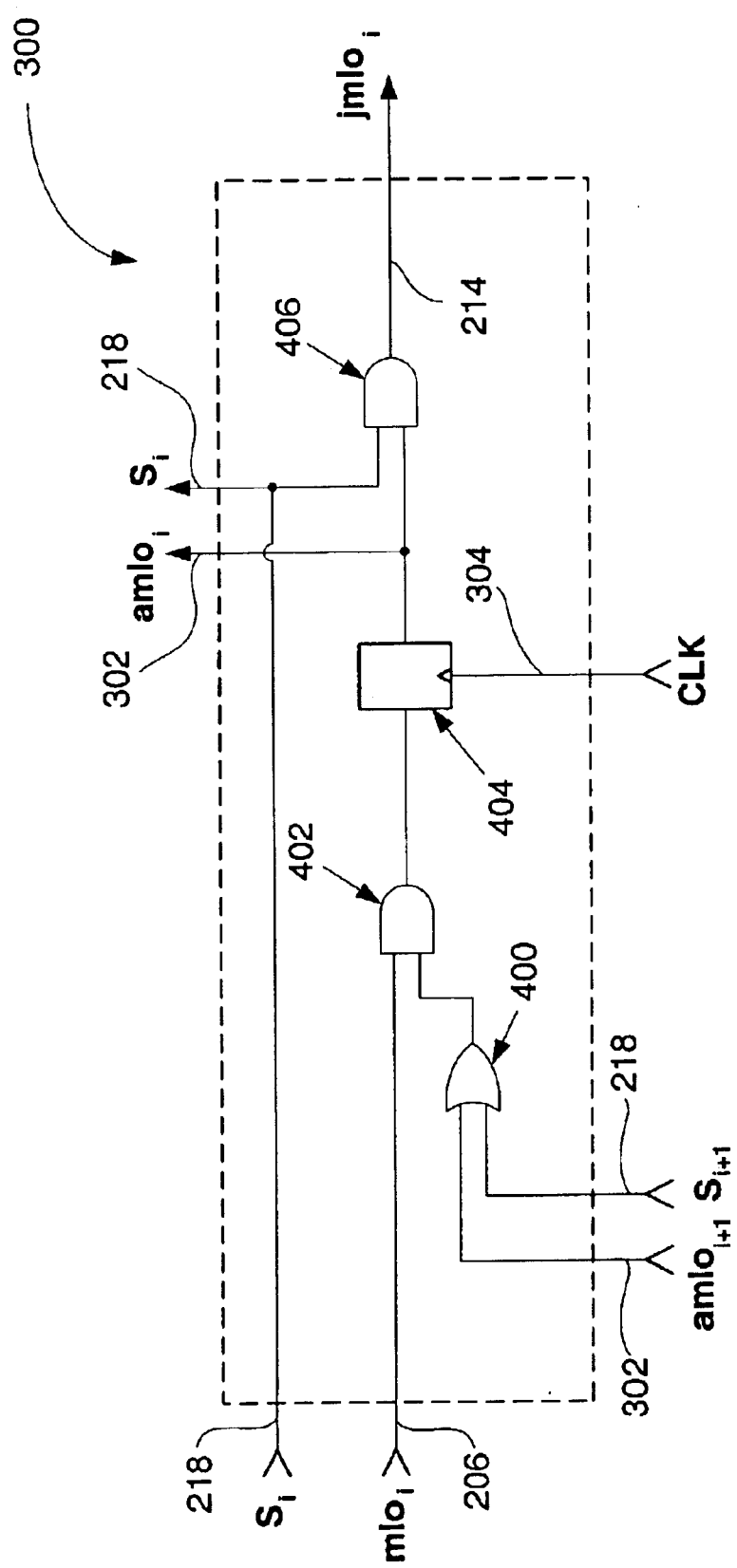
FIG. 4 is a schematic diagram showing a serial AND computational unit, in accordance with an embodiment of the present invention.

FIG. 4 is a schematic diagram showing a serial AND computational unit 300, in accordance with an embodiment of the present invention. The serial AND computational unit 300 includes an OR gate 400 coupled to an AND gate 402, which is further coupled to a flip-flop 404 controlled by the clock signal 304. The flip-flop 404 is further coupled to an AND gate 406, which provides the match line result 214 for the serial AND computational unit 300.

In operation, the OR gate 400 of the serial AND computational unit 300 receives as inputs the internal match line result amlo$_{i+1}$ 302 and the word boundary bit S$_{i+1}$ 218 from the adjacent serial AND computational unit. The output of the OR gate 400 is then provided to the AND gate 402, which also receives the match line 206 for the bit pattern row. The result of the AND gate 402 is then stored by the flip-flop 404. The output of the flip-flop 404 is the internal match line result amlo$_i$ 302 for the serial AND computational unit 300. The internal match line result amlo$_i$ 302 represents the combination of the internal match line result amlo$_{i+1}$ 302 from the adjacent serial AND computational unit and the match line 206 for the current bit pattern row.

However, because an OR operation is performed on the adjacent internal match line result amlo$_{i+1}$ 302 and the word boundary bit S$_{i+1}$ 218, the internal match line result amlo$_i$ 302 can represent only the match line 206 for the current bit pattern row. In particular, if the adjacent word boundary bit S$_{i+1}$ 218 is a "1," meaning the adjacent bit pattern row is a new word entry, the output of the OR gate 400 will be a "1" regardless of the state of the adjacent internal match line result 302. Hence, the internal match line result amlo$_i$ 302 will represent only the match line 206 for the current bit pattern row.

As mentioned previously, the internal match line result amlo$_i$ 302 is provided to an adjacent serial AND computational unit. In addition, the internal match line result amlo$_i$ 302 is provided to the AND gate 406, which combines the internal match line result amlo$_i$ 302 with the word boundary bit S$_i$ 218 to produce the match line result 214. As discussed above, generally only the serial AND computational unit 300 corresponding to the bit pattern row of the word entry having the lowest address provides the match line result 214 for the word entry. Serial AND computational units 300 corresponding to the remaining bit pattern rows of the word entry are forced to output "0" on the match line result 214 line. To this end, the AND gate 406 is only capable of outputting a "1" result when the word boundary bit S$_i$ 218 for the current bit pattern row is a "1," indicating the tail of a word entry. In this case, the match line result 214 for the word entry will match the internal match line result amlo$_i$ 302 for the serial AND computational unit 300.

FIGS. 5A and 5B illustrate sections of a boundary array 210 corresponding to word entries of various sizes. In particular, FIG. 5A is a chart 500 showing word boundary bit 218 values for four word entries each comprising a single bit pattern row, in accordance with an embodiment of the present invention. The chart 500 shows four bit entry rows 208 and their corresponding word boundary bits 218 from the boundary array. In this embodiment, a word boundary bit 218 with a value of "1" indicates the start of a new word. Hence, because each word entry comprises a single bit pattern row 208 in the example of FIG. 5A, the word boundary bit 218 for each bit entry row 208 has a value of "1" indicating each bit entry row 208 is the beginning of a new word entry.

FIG. 5B is a chart 502 showing word boundary bit 218 values for two word entries each comprising two bit pattern rows, in accordance with an embodiment of the present invention. As above, the chart 502 shows four bit entry rows 208 and their corresponding word boundary bits 218 from the boundary array. Also as above, a word boundary bit 218 with a value of "1" indicates the start of a new word. Hence, if a word spans multiple bit pattern rows 208, the word boundary bit 218 corresponding to the bit pattern row 208 having the lowest address in the CAM cores 202 has a value of "1." The word boundary bits 218 of subsequent bit pattern rows 208 corresponding to the remainder of the word have a value of a "0."

For example, bit pattern row 0 208a and bit pattern row 1 208b represent a single large word entry, where bit pattern row 0 208a has a lower address than bit pattern row 1 208b. Hence, bit pattern row 0 208a has a value of "1" indicating the start of the word entry, and the remaining bit pattern row 1 208b has a value of "0." Bit pattern row 2 208c is the start of a new word entry, and hence, the corresponding word boundary bit 218 has a value of "1," indicating the start of the new word entry. As above, the remaining bit pattern row 3 208d has a value of "0." In addition to indicating the start of word entries, the word boundary bits 218 can be used to indicate the boundary of large word entries, as described next with reference to FIG. 6.

Figure 6:
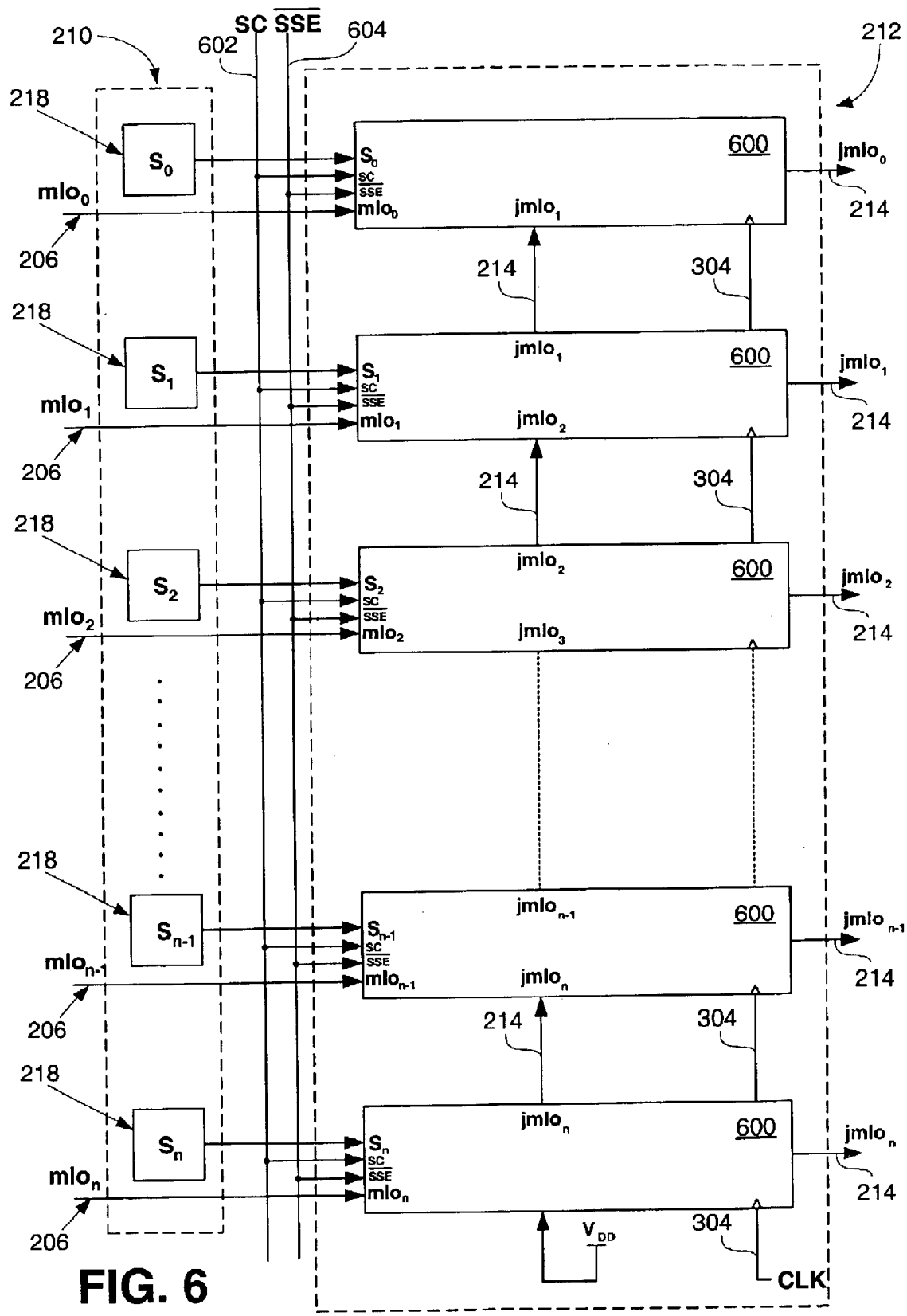
FIG. 6 is a schematic block diagram showing a serial AND array using control signal's for search operations, in accordance with an embodiment of the present invention.

FIG. 6 is a schematic block diagram showing a serial AND array 212 using control signals for search operations, in accordance with an embodiment of the present invention. The serial AND array 212 includes a plurality of serial AND computational units 600, which receive as inputs word boundary bits 218 from the boundary array 210 and match lines 206 from the CAM cores. In addition, each serial AND computational unit 600 receives a match line result 214 from an adjacent serial AND computational unit 600, a control signal SC 602 that indicates the end of a search, and a control signal $\overline{SSE}$ 604 indicating the beginning of a search. To ensure operability, the last serial AND computational unit 600, coupled to the bit pattern entry having the highest address, is attached to a voltage source, as shown in FIG. 6. Further, a common clock signal 304 is provided to each serial AND computational unit 600.

In operation, the serial AND computational units 600 synthesize a match line result 214 that resembles a solution that would occur had there been a very large word comprising a single bit pattern row. More particularly, the serial AND computational units 600 combine the match lines 206 from bit pattern rows comprising a single word entry, and output the match line result 214 from the serial AND computational unit 600 corresponding to the bit pattern row having the lowest memory address. The match line results 214 corresponding to the bit pattern rows of the remainder of the word entry are forced to a miss or "0." To facilitate match line 206 combining, each serial AND computational unit 600 receives the match line result 214 from an adjacent serial AND computational unit 600, as described in greater detail below.

Figure 7:
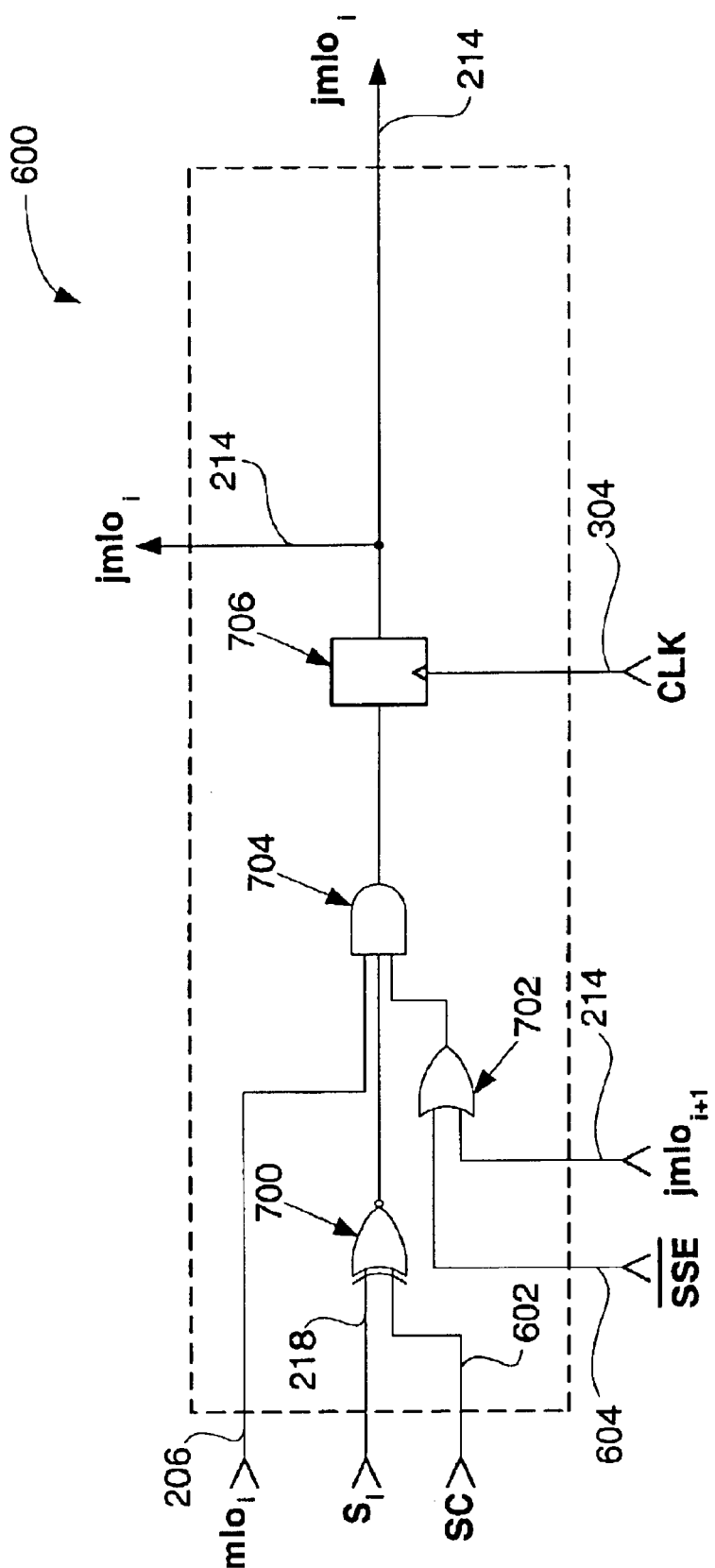
FIG. 7 is a schematic diagram showing a serial AND computational unit, in accordance with an embodiment of the present invention.

FIG. 7 is a schematic diagram showing a serial AND computational unit 600, in accordance with an embodiment of the present invention. The serial AND computational unit 600 includes an XNOR gate 700 and an OR gate 702, each coupled as an input to an AND gate 704. The output of the AND gate 704 is provided to a flip-flop 706 controlled by the clock signal 304. The flip-flop 706 provides the match line result 214 for the bit pattern row.

In operation, the XNOR gate 700 of the serial AND computational unit 600 receives as inputs the word boundary bit S. 218 for the bit pattern row and the SC 602 control signal. In addition, the OR gate 702 receives as inputs the match line result 214 from the adjacent serial AND computational unit and the $\overline{SSE}$ control signal 604. The output of the XNOR gate 700 and the output of the OR gate 702 are provided as inputs to the AND gate 704 along with the match line 206 for the current bit pattern row. The result of the AND gate 704 is then stored by the flip-flop 706, the output of which provides the combined match line result 214 for one or more bit pattern rows.

In one embodiment, multiple search cycles are used to search word entries spanning multiple bit pattern rows. To signal the beginning and end of the complete search, search control signals SC 602 and $\overline{SSE}$ 604 are used. In particular, control signal $\overline{SSE}$ 604 indicates the beginning cycle of a search and control signal SC 602 indicates the ending cycle of a search. Thus, during the first cycle (cycle 0) of a search, control signal $\overline{SSE}$ is high and during the last cycle of a search, control signal SC 602 is high, as illustrated next with reference to FIG. 8.

Figure 8:
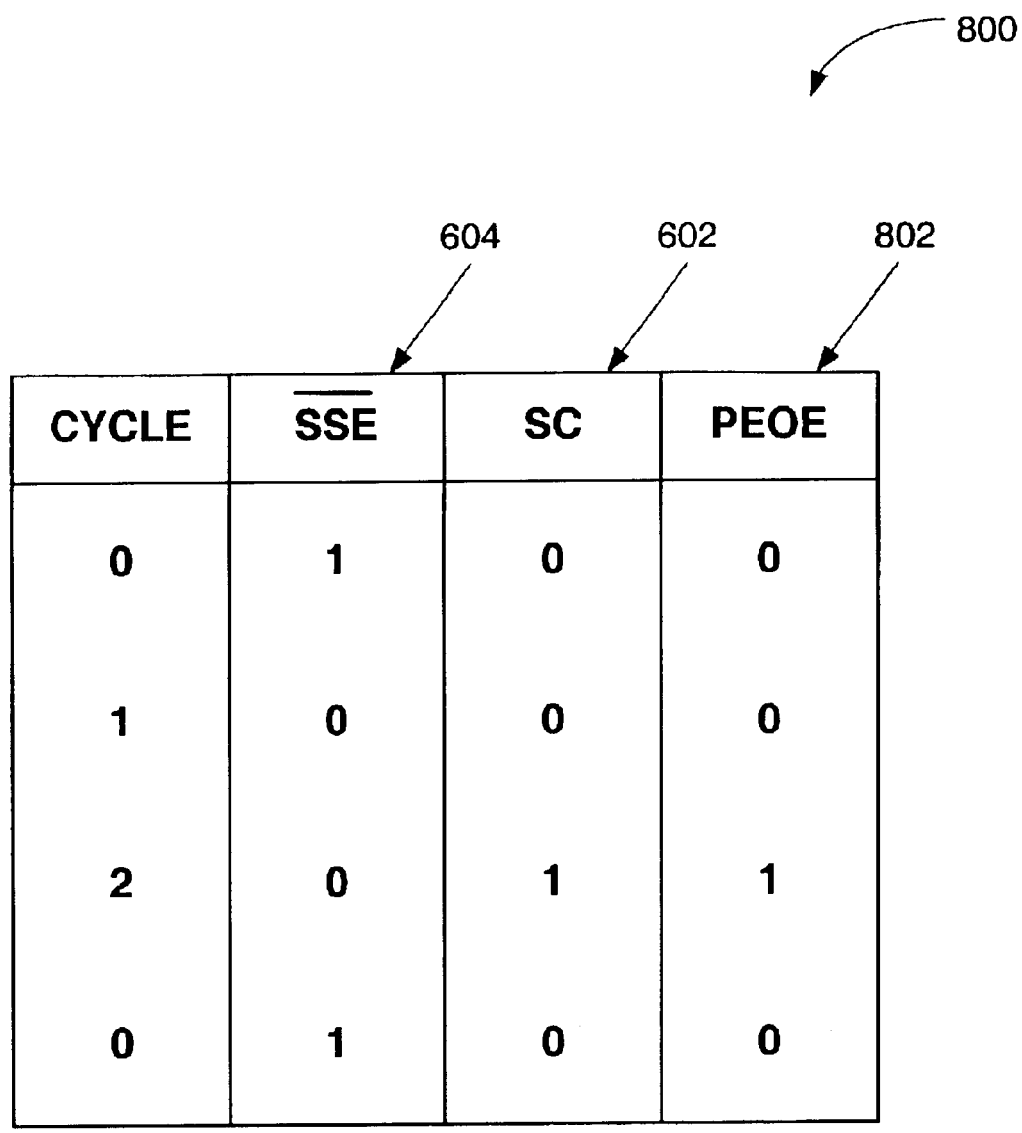
FIG. 8 is a chart showing the controls signals used in a multiple cycle search, in accordance with an embodiment of the present invention.

FIG. 8 is a chart 800 showing the controls signals used in a multiple cycle search, in accordance with an embodiment of the present invention. The chart 800 illustrates exemplary values for control signal $\overline{SSE}$ 604, control signal SC 602, and a priority controller control signal PEOE 802. Priority controller control signals are further discussed in U.S. patent application Ser. No. 09/642,253, filed Aug. 17, 2000, and entitled "Priority Encoder With Multiple Match Function For Content Addressable Memories And Methods For Making The Same," which is incorporated herein by reference.

In particular, the chart 800 illustrates control signal values for a three cycle, three row search. As shown, during cycle 0 the $\overline{SSE}$ 604 control signal is asserted to indicate the beginning of the search, while the SC 602 control signal is low indicating the end of the search has not yet been reached. The priority encoder control signal PEOE 802 is low indicating that the priority encoder should not yet output the search result. Next, during clock cycle 1 both control signals SC 602 and $\overline{SSE}$ 604 are low, indicating neither the start nor end of the search is occurring this cycle. Again, as in clock cycle 0, the priority encoder control signal PEOE 802 remains low during clock cycle 1. Search cycle 2 is the last cycle for the current search, therefore control signal SC 602 is asserted to indicate the end of the current search and control signal $\overline{SSE}$ 604 is allowed to remain low. Thereafter, a new search begins with the next cycle 0, as shown in FIG. 8. Thus, based on the control signals, the states of the match lines 206 and the states of the adjacent match line results 214 of the remaining serial AND computational units 600 comprising the word entry, the final match line result 214 for the word entry can be obtained.

In order to search wide words as described above, a particular sequence of searching is followed to generate the proper match line information (206 and 214). Tables 10–13 below illustrate examples of how searches can be conducted for various search directionalities and word widths for data stored as shown in tables 2–9. Although the examples show signal SC for the implementations of FIGS. 6 and 7, it should be noted that the signal SC is not required for the implementation shown in FIGS. 3 and 4.

Table 10 below illustrates a two-row ascending search data "F" using unique tags.

TABLE 10

| Cycle | Applied Search Data | Applied Search Tag | $\overline{SSE}$ | SC | PEOE |
|---|---|---|---|---|---|
| 0 | DataB1-F | B | 1 | 0 | 0 |
| 1 | DataB2-F | B | 0 | 1 | 1 |

Table 11 below illustrates a two-row descending search data "F" using unique tags.

TABLE 11

| Cycle | Applied Search Data | Applied Search Tag | $\overline{SSE}$ | SC | PEOE |
|---|---|---|---|---|---|
| 0 | DataB2-F | B | 1 | 0 | 0 |
| 1 | DataB1-F | B | 0 | 1 | 1 |

Table 12 below illustrates a four-row ascending search data "H" using unique tags.

TABLE 12

| Cycle | Applied Search Data | Applied Search Tag | $\overline{SSE}$ | SC | PEOE |
|---|---|---|---|---|---|
| 0 | DataD1-H | D | 1 | 0 | 0 |
| 1 | DataD2-H | D | 0 | 0 | 0 |
| 2 | DataD3-H | D | 0 | 0 | 0 |
| 3 | DataD4-H | D | 0 | 1 | 1 |

Table 13 below illustrates a four-row descending search data "H" using unique tags.

TABLE 13

| Cycle | Applied Search Data | Applied Search Tag | $\overline{SSE}$ | SC | PEOE |
|---|---|---|---|---|---|
| 0 | DataD4-H | D | 1 | 0 | 0 |
| 1 | DataD3-H | D | 0 | 0 | 0 |
| 2 | DataD2-H | D | 0 | 0 | 0 |
| 3 | DataD1-H | D | 0 | 1 | 1 |

Figure 9A:
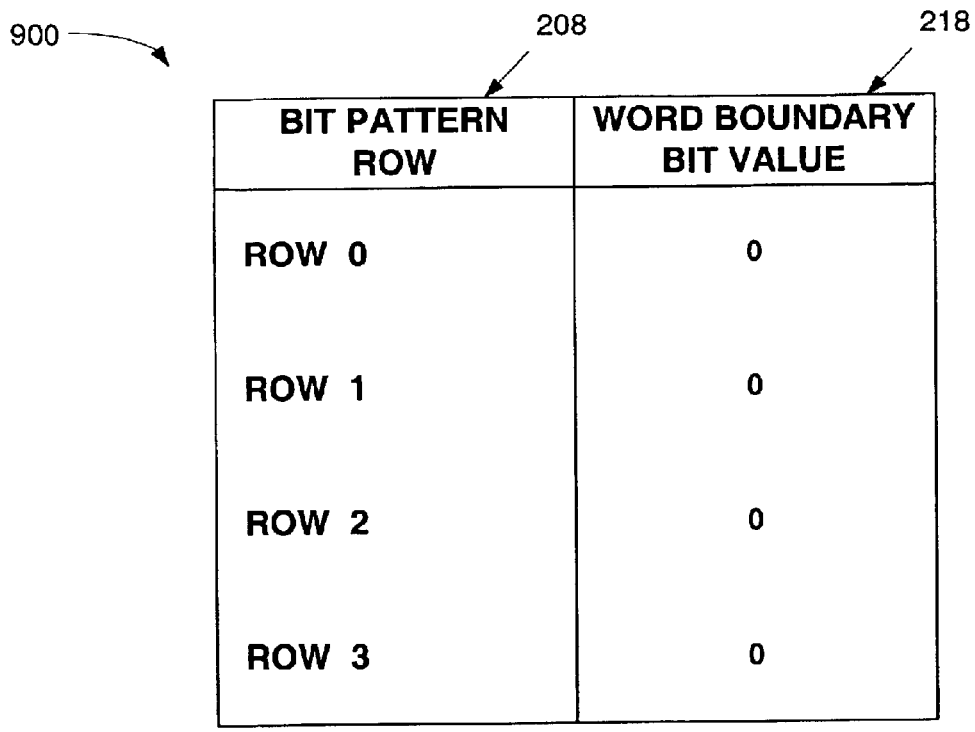
FIG. 9A is a chart showing word boundary bit values for four word entries each comprising a single bit pattern row, in accordance with an embodiment of the present invention.
Figure 9B:
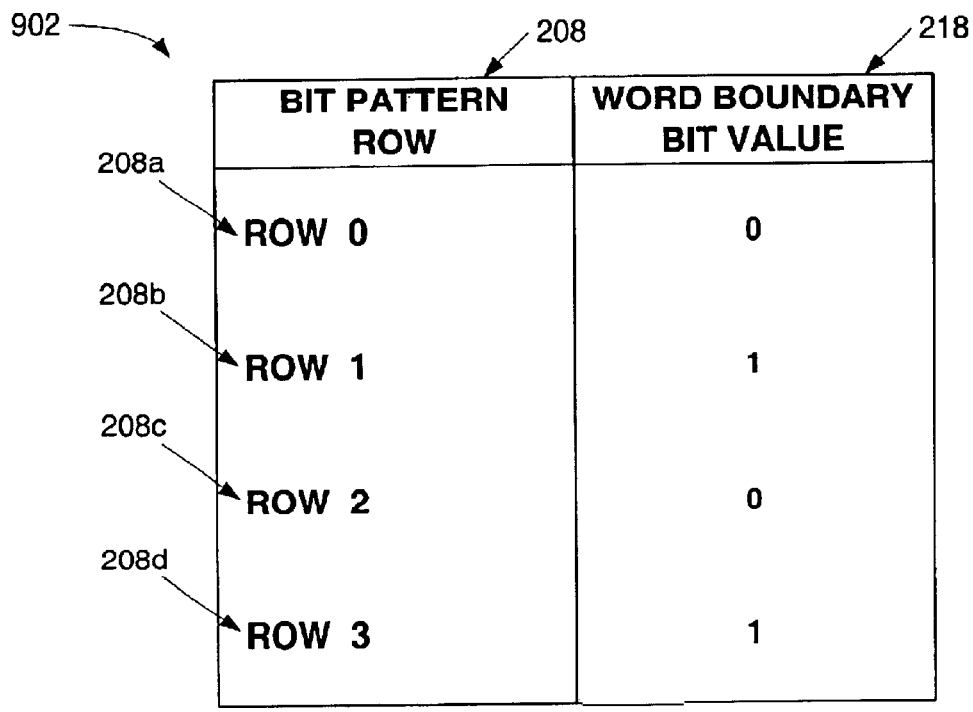
FIG. 9B is a chart showing word boundary bit values for two word entries each comprising two bit pattern rows, in accordance with an embodiment of the present invention.

FIGS. 9A and 9B illustrate sections of a boundary array 210 corresponding to word entries of various sizes for the embodiment of FIG. 7. In particular, FIG. 9A is a chart 900 showing word boundary bit 218 values for four word entries each comprising a single bit pattern row, in accordance with an embodiment of the present invention. The chart 900 shows four bit entry rows 208 and their corresponding word boundary bits 218 from the boundary array. In this embodiment, a word boundary bit 218 with a value of "1" indicates the beginning of a multiple bit pattern row word. Hence, because each word entry comprises a single bit pattern row 208 in the example of FIG. 9A, the word boundary bit 218 for each bit entry row 208 has a value of "1" indicating there are no multiple bit pattern row word entries in the chart 900.

FIG. 9B is a chart 902 showing word boundary bit 218 values for two word entries each comprising two bit pattern rows, in accordance with an embodiment of the present invention. As above, the chart 902 shows four bit entry rows 208 and their corresponding word boundary bits 218 from the boundary array. Also as above, a word boundary bit 218 with a value of "1" indicates the beginning of a multiple bit pattern row word. Hence, if a word spans multiple bit pattern rows 208, the word boundary bit 218 corresponding to the bit pattern row 208 having the lowest address in the CAM cores has a value of "1." The word boundary bits 218 of the bit pattern rows 208 corresponding to the remainder of the word have a value of "0."

For example, bit pattern row 0 208a and bit pattern row 1 208b represent a single large word entry, where bit pattern row 1 208b has a higher address than bit pattern row 0 208a. Hence, bit pattern row 0 208a has a value of "1" indicating the beginning of the word entry, and the remaining bit pattern row 1 208b has a value of "0." Bit pattern row 2 208c is the start of a new word entry, and hence, the corresponding word boundary bit 218 has a value of "1," and the ending bit pattern row 3 208d has a value of "0."

In the examples discussed thus far, unique tag bits have been used to specify the width of an entry in memory. To reduce the number of tag bits needed to support additional word widths, one embodiment of the present invention utilizes differential width tags to specify the width of an entry in memory. Using differential width tags, only two additional code words are required to specify any multi-row CAM entry. Specifically, a "Head" of the entry word row is indicated with one code word and all other rows within the multi-row entry store a "non-head" tag value. In the following examples, "H" will indicate the "Head" of the entry word row and "NH" will indicate the "non-head" of the entry word row. "H" can have any logic value as long as "NH" is different than "H."

If the CAM entry spans only one row, the tag value for the CAM entry is always "Head." For ascending search configurations, if the CAM entry spans more than one row, the CAM row with the lowest address receives the "Head" value and all other rows within the multi-row entry receive the "non-head" value. For descending search configurations, if the CAM entry spans more than one row, the CAM row with the highest address receives the "Head" value and all other rows within the multi-row entry receive the "non-head" value. In the following examples, Row i is any row in the CAM array, where i is an integer greater than or equal to zero.

Table 14 below illustrates a differential tag value for a single row entry for both ascending and descending search configurations.

TABLE 14

| Tag Value | Row |
|---|---|
| H | i |

Table 15 below illustrates differential tag values for a double row entry for an ascending search configuration.

TABLE 15

| Tag Value | Row |
|---|---|
| H | i |
| NH | i + 1 |

Table 16 below illustrates differential tag values for a double row entry for a descending search configuration.

TABLE 16

| Tag Value | Row |
|---|---|
| NH | i |
| H | i + 1 |

Table 17 below illustrates differential tag values for a three-row entry for an ascending search configuration.

TABLE 17

| Tag Value | Row |
|---|---|
| H | i |
| NH | i + 1 |
| NH | i + 2 |

Table 18 below illustrates differential tag values for a three-row entry for a descending search configuration.

TABLE 18

| Tag Value | Row |
|---|---|
| NH | i |
| NH | i + 1 |
| H | i + 2 |

Table 19 below illustrates differential tag values for a four-row entry for an ascending search configuration.

TABLE 19

| Tag Value | Row |
|---|---|
| H | i |
| NH | i + 1 |
| NH | i + 2 |
| NH | i + 3 |

Table 20 below illustrates differential tag values for a four-row entry for a descending search configuration.

TABLE 20

| Tag Value | Row |
|---|---|
| NH | i |
| NH | i + 1 |
| NH | i + 2 |
| H | i + 3 |

Tables 21–27 below illustrate data storage examples using the differential tag scheme described above. Table 21 illustrates four single row stored CAM entries for both ascending and descending searches using differential width tags.

TABLE 21

| Row | Stored Tag | Stored Data | Store Boundary Bit |
|---|---|---|---|
| 0 | H | DataA1-A | T |
| 1 | H | DataA1-B | T |
| 2 | H | DataA1-C | T |
| 3 | H | DataA1-D | T |

Table 22 illustrates two double row stored CAM entries for an ascending search using differential width tags.

TABLE 22

| Row | Stored Tag | Stored Data | Store Boundary Bit |
|---|---|---|---|
| 0 | H | DataB1-E | NT |
| 1 | NH | DataB2-E | T |
| 2 | H | DataB1-F | NT |
| 3 | NH | DataB2-F | T |

Table 23 below illustrates two double row stored CAM entries for a descending search using differential width tags.

TABLE 23

| Row | Stored Tag | Stored Data | Store Boundary Bit |
|---|---|---|---|
| 0 | NH | DataB1-E | T |
| 1 | H | DataB2-E | NT |
| 2 | NH | DataB1-F | T |
| 3 | H | DataB2-F | NT |

Table 24 below illustrates a four row stored CAM entry for an ascending search using differential width tags.

TABLE 24

| Row | Stored Tag | Stored Data | Store Boundary Bit |
|---|---|---|---|
| 0 | H | DataD1-G | NT |
| 1 | NH | DataD2-G | NT |
| 2 | NH | DataD3-G | NT |
| 3 | NH | DataD4-G | T |

Table 25 below illustrates a four row stored CAM entry for a descending search using differential width tags.

TABLE 25

| Row | Stored Tag | Stored Data | Store Boundary Bit |
|---|---|---|---|
| 0 | NH | DataD1-G | T |
| 1 | NH | DataD2-G | NT |
| 2 | NH | DataD3-G | NT |
| 3 | H | DataD4-G | NT |

In addition, a heterogeneous mixture of various entry sizes can be stored within the same array, as illustrated below in Tables 26 and 27. Table 26 below shows an example of a four-row stored CAM entry and a double-row stored CAM entry for an ascending search using differential tags.

TABLE 26

| Row | Stored Tag | Stored Data | Store Boundary Bit |
|---|---|---|---|
| 0 | H | DataD1-G | NT |
| 1 | NH | DataD2-G | NT |
| 2 | NH | DataD3-G | NT |
| 3 | NH | DataD4-G | T |
| 4 | H | DataB1-H | NT |
| 5 | NH | DataB2-H | T |

Table 27 shows an example of a four-row stored CAM entry and a double-row stored CAM entry for a descending search using differential tags.

TABLE 27

| Row | Stored Tag | Stored Data | Store Boundary Bit |
|---|---|---|---|
| 0 | NH | DataD1-G | T |
| 1 | NH | DataD2-G | NT |
| 2 | NH | DataD3-G | NT |
| 3 | H | DataD4-G | NT |
| 4 | NH | DataB1-H | T |
| 5 | H | DataB2-H | NT |

In operation, the applied search tag is H for the first cycle. Any subsequent cycles required use the NH value for the applied search tag. The order of the applied search data follows the same order as the search directionality. Tables 28–31 show examples of searches using the differential tags described above. Table 28 shows an ascending search for double-row stored search data "F" using differential tags.

TABLE 28

| Cycle | Applied Search Data | Applied Search Tag | $\overline{SSE}$ | SC | PEOE |
|---|---|---|---|---|---|
| 0 | DataB1-F | H | 1 | 0 | 0 |
| 1 | DataB2-F | NH | 0 | 1 | 1 |

Table 29 shows an ascending search for double-row stored search data "F" using differential tags.

TABLE 29

| Cycle | Applied Search Data | Applied Search Tag | $\overline{SSE}$ | SC | PEOE |
|---|---|---|---|---|---|
| 0 | DataB2-F | H | 1 | 0 | 0 |
| 1 | DataB1-F | NH | 0 | 1 | 1 |

Table 30 shows an ascending search for four-row stored search data "H" using differential tags.

TABLE 30

| Cycle | Applied Search Data | Applied Search Tag | $\overline{SSE}$ | SC | PEOE |
|---|---|---|---|---|---|
| 0 | DataD1-H | H | 1 | 0 | 0 |
| 1 | DataD2-H | NH | 0 | 0 | 0 |
| 2 | DataD3-H | NH | 0 | 0 | 0 |
| 3 | DataD4-H | NH | 0 | 1 | 1 |

Table 30 shows a descending search for four-row stored search data "H" using differential tags.

TABLE 31

| Cycle | Applied Search Data | Applied Search Tag | $\overline{SSE}$ | SC | PEOE |
|---|---|---|---|---|---|
| 0 | DataD4-H | H | 1 | 0 | 0 |
| 1 | DataD3-H | NH | 0 | 0 | 0 |
| 2 | DataD2-H | NH | 0 | 0 | 0 |
| 3 | DataD1-H | NH | 0 | 1 | 1 |

Figure 10:
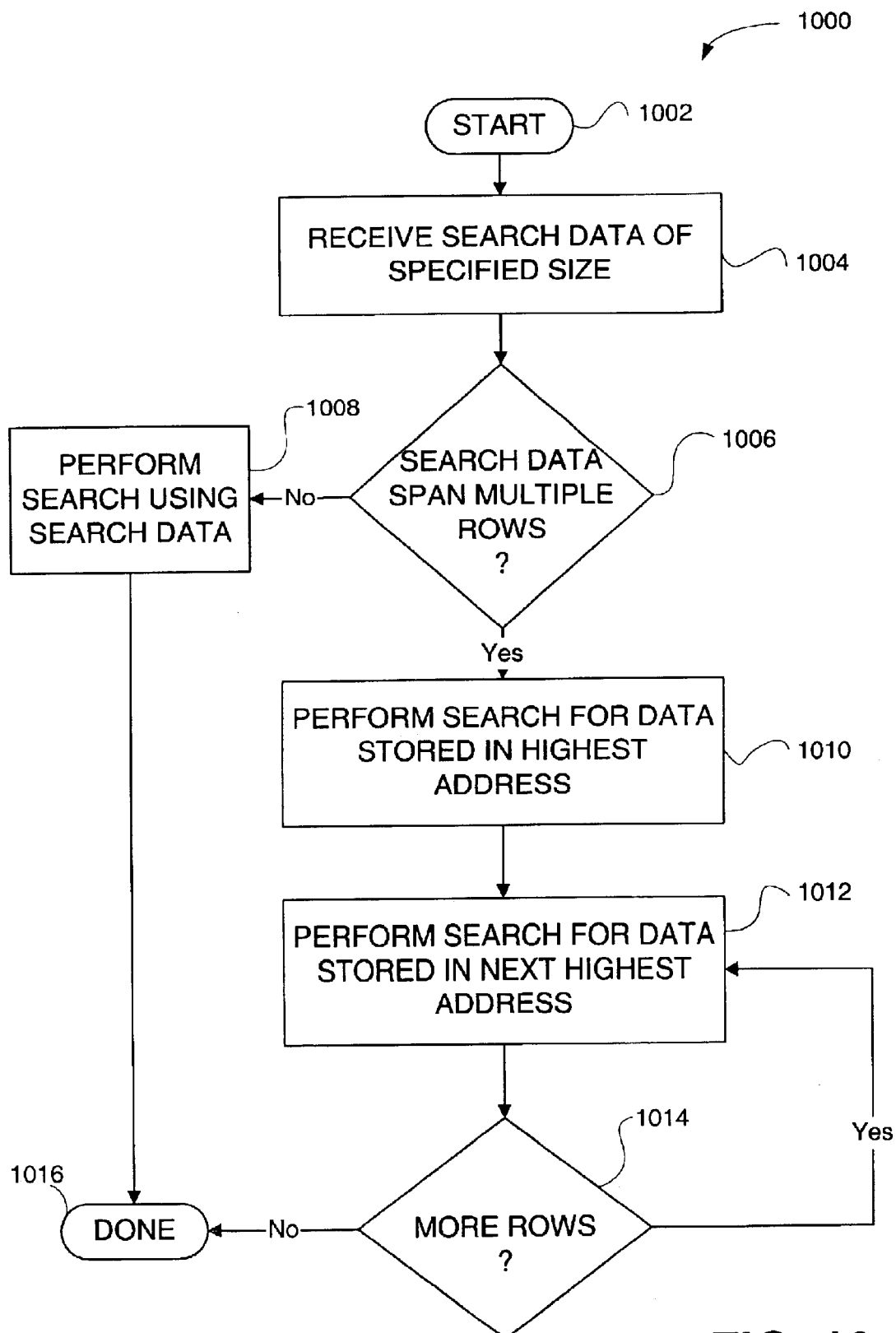
FIG. 10 is a flowchart showing a method for performing a CAM searching using wide word entries spanning multiple bit pattern rows, in accordance with an embodiment of the present invention.

FIG. 10 is a flowchart showing a method 1000 for performing a CAM searching using wide word entries spanning multiple bit pattern rows, in accordance with an embodiment of the present invention. In an initial operation 1002, preprocess operations are performed. Preprocess operations include storing data in CAM memory, configuring the boundary array for multiple bit pattern row entries, and other preprocess operations that will be apparent to those skilled in the art.

In operation 1004, the search data for the search operation is received on the input bus. The search data can be of varying widths, as desired by the user. Wide search data may need to be received over multiple clock cycles depending on the width of the input bus. In addition, generally a field, or Tag, indicating the width of the search data is received along with the search data, as described in greater detail in U.S. patent application Ser. No. 09/654,316, filed Sep. 1, 2000, and entitled "Variable Width Content Addressable Memory Device For Searching Variable Width Data."

A decision is then made as to whether the search data spans multiple bit pattern rows in CAM memory, in operation 1006. As mentioned previously, data that spans multiple bit pattern rows in CAM memory may be stored and searched using the embodiments of the present invention. If the search data does not span multiple bit pattern rows in CAM memory, the method 1000 continues with operation 1008. Otherwise, the method 1000 continues with operation 1010.

When the search data is not being compared to data spanning multiple bit pattern rows, a search is performed using the received search data in operation 1008. This search is performed as described above with reference to FIGS. 4 and/or 7. Generally, a single clock cycle can be used to search the entire search data in operation 1008. The method is then completed in operation 1016.

In operation 1010, a search is performed for the data stored in the portion of the word having the highest address.

Specifically, a search is performed using the portion of the search data that is expected to match the highest addressed portion of the word entry. For example, if a word entry spans three bit pattern rows, the portion of the word entry row stored in the last, or third row, of the entry is searched during operation 1010 using the corresponding portion of the search data.

In operation 1012, a search is performed for the data stored in the portion of the word having the next highest address. Similar to operation 1010, a search is performed using the portion of the search data that is expected to match the next highest addressed portion of the word entry. For example, the next highest address portion of a word entry after the third row, is the second row of the entry.

A decision is then made, in operation 1014, as to whether the search data spans additional bit pattern rows. If the search data spans additional bit pattern rows, the method 1000 continues with another operation 1012. Otherwise the method is completed in operation 1016.

Post process operations are performed in operation 1016. Post process operations include post processing of the search results, further search operations, and other post process operations that will be apparent to those skilled in the art. Advantageously, the embodiments of the present invention can perform searches for wide word entries spanning multiple bit pattern entry rows without altering the physical width of CAM memory. Thus, adverse consequences, such as reduced efficiency and increased cost, associated with physically wide CAM memory are avoided using the embodiments of the present invention.

Figure 11:
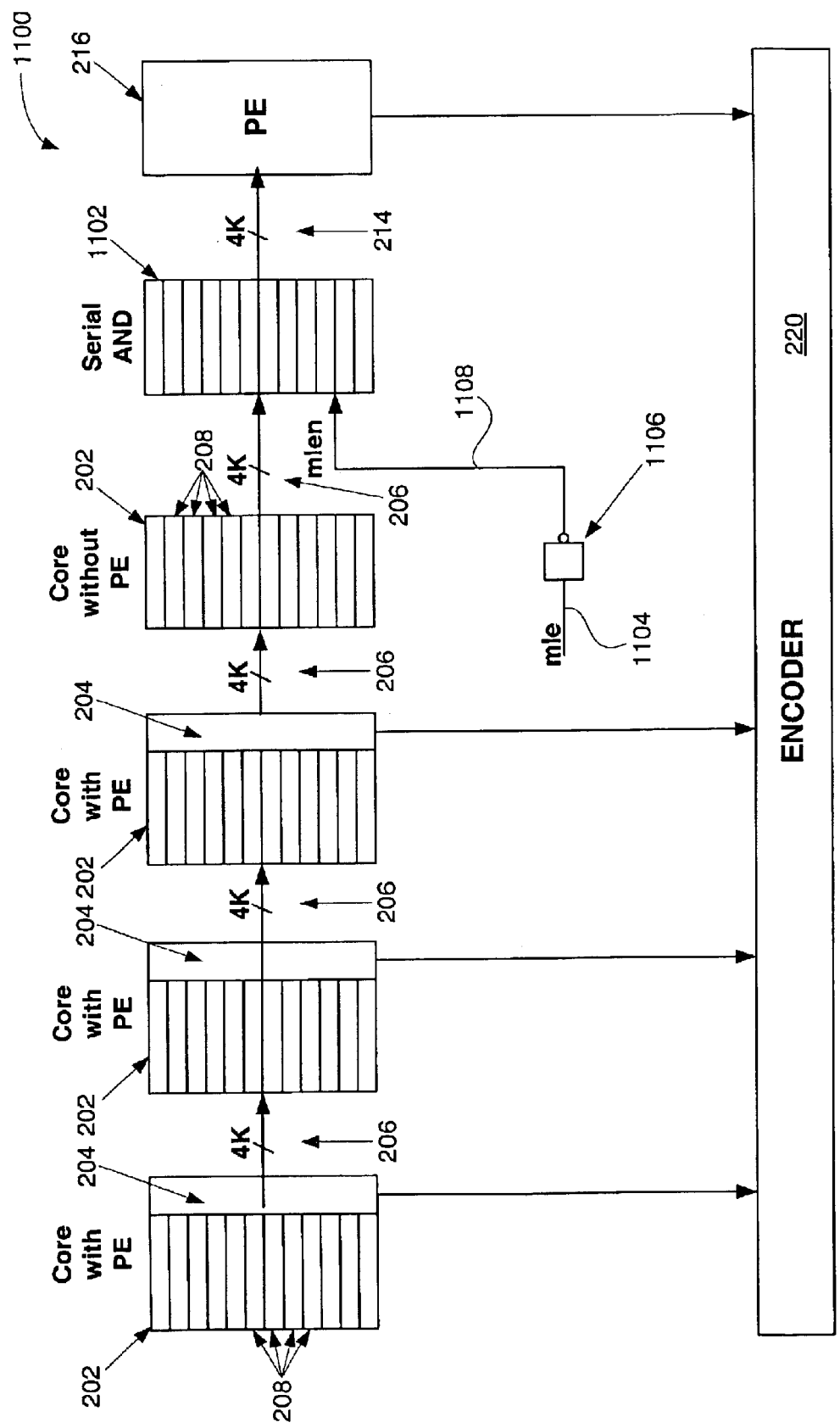
FIG. 11 is a block diagram showing a wide word CAM system having a match line enable, in accordance with an embodiment of the present invention.

In addition to the wide word CAM systems described above, embodiments of the present invention can provide wide word searching using a match line enable instead of a boundary bit array. FIG. 11 is a block diagram showing a wide word CAM system 1100 having a match line enable, in accordance with an embodiment of the present invention. Similar to the above mentioned wide word CAM systems, the wide word CAM system 1100 includes a plurality of CAM cores 202 having local priority encoders 204, which are each further coupled to a main priority encoder 220. Each CAM core 202 includes a plurality of bit pattern entry rows 208, which are used to store the data for the CAM. In the example of FIG. 11, each CAM core 202 includes 4K bit pattern rows 208, however, it should be noted that any number of bit pattern rows 208 may be included in the CAM cores depending on the CAM design and needs of the user.

In addition, the CAM system 1100 includes a CAM core 202, which does not include priority encoder. Although the wide word CAM system 1100 is illustrated in FIG. 11 having four CAM cores, it should be noted that any number of CAM cores can be included in the wide word CAM system 1100 using the embodiments of the present invention.

Each CAM core 202 is coupled to the next CAM core 202 via match lines 206. As above, although FIG. 11 shows 4K of match lines 206, it should be borne in mind that any number of match lines 206 can be utilized depending on the CAM core design and the needs of the user. As above, bit pattern entries of variable widths can be implemented utilizing the CAM system 1100 using tag bits, which define the width of a word.

The wide word CAM system 1100 further includes a serial AND array 1102. The serial AND array 1102 receives as inputs the match line outputs 206 of the CAM core 202, which does not include a priority, and a match line enable output signal 1108 from a match line enable latch 1106. The match line enable latch 1106 receives a match line enable input signal 1104, and inverts the signal 1104 to generate the match line enable output signal 1108.

The serial AND array 1102, in conjunction with the match line enable latch 1106, allows embodiments of the present invention to perform search operations using words spanning multiple bit pattern rows 208, in addition to variable word widths as described above. As above, the serial AND array 1102 combines the match lines 206 of word entries that span multiple bit pattern rows 208 and synthesizes a match line result 214 that resembles a solution that would occur had there been a very large word comprising a single bit pattern row. Specifically, the serial AND array 1102 comprises a plurality of serial AND computational units, which use the match lines 206 and the match line enable output signal 1108 as inputs to compute a match line result 214 for each word entry regardless of how many bit pattern rows 208 the word entry spans. The match line results 214 from the serial AND array 1102 are provided to the priority encoder 216, which generates the highest priority matching address.

Figure 12:
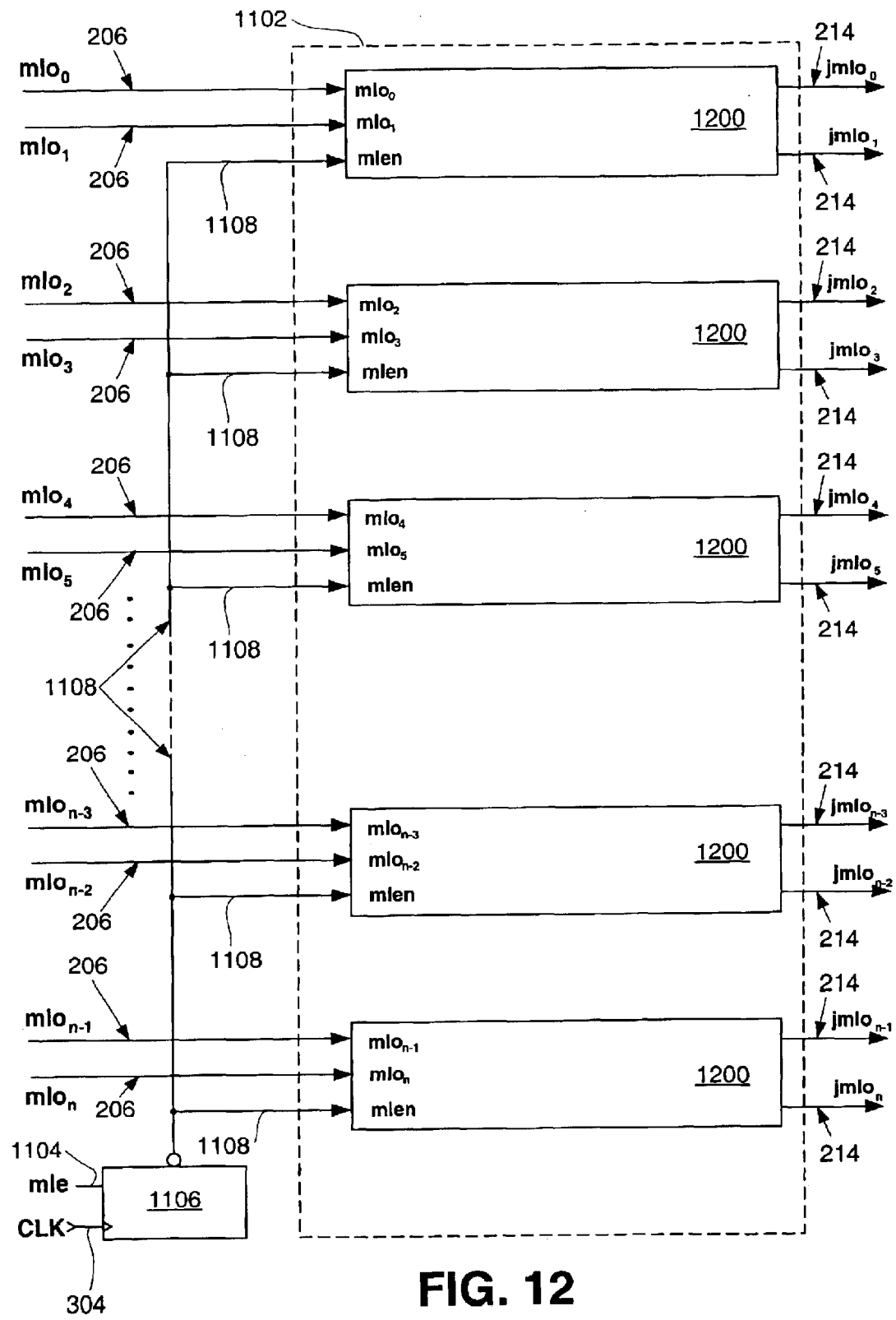
FIG. 12 is a schematic block diagram showing a serial AND array, in accordance with an embodiment of the present invention.

FIG. 12 is a schematic block diagram showing a serial AND array 1102, in accordance with an embodiment of the present invention. The serial AND array 1102 includes a plurality of serial AND computational units 1200, which receive as inputs two adjacent match lines 206 from the CAM cores and the match line enable output signal 1108.

In operation, each serial AND computational unit 1200 synthesizes a match line result 214 that resembles a solution that would occur had there been a very large word comprising a single bit pattern row. More particularly, the serial AND computational units 1200 combine the match lines 206 from bit pattern rows comprising a single word entry, and output the match line result 214 from the serial AND computational unit 1200 corresponding to the bit pattern row of the word entry having the lowest memory address, as described in greater detail below with reference to FIG. 13.

Figure 13:
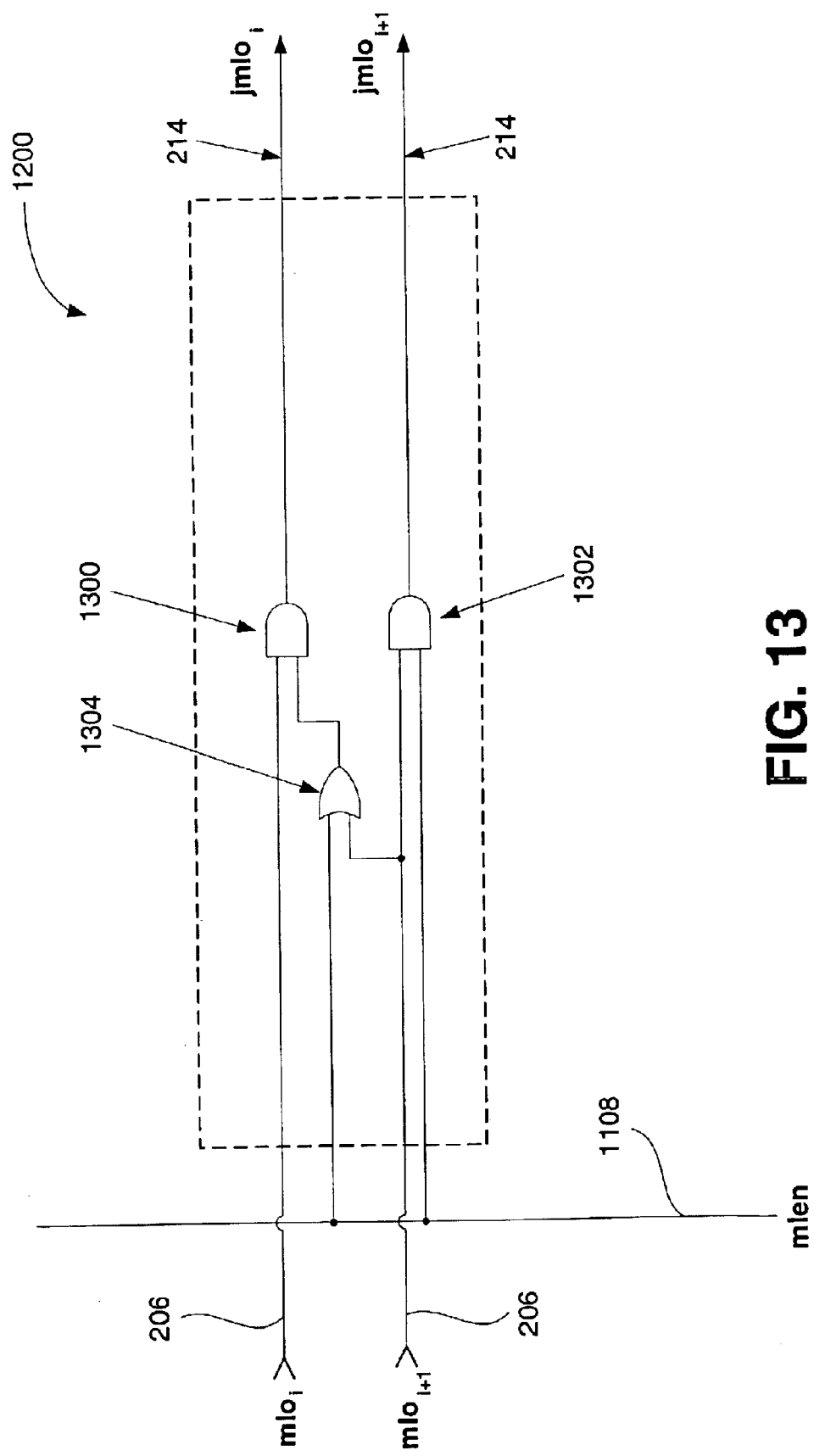
FIG. 13 is a schematic diagram showing a serial AND computational unit, in accordance with an embodiment of the present invention.

FIG. 13 is a schematic diagram showing a serial AND computational unit 1200, in accordance with an embodiment of the present invention. The serial AND computational unit 1200 includes an OR gate 1304 coupled to a first AND gate 1300, which provides a first match line result 214 for the serial AND computational unit 1200. The serial AND computational unit 1200 also includes a second AND gate 1302, which provides a second match line result 214 for the serial AND computational unit 1200. As inputs, the serial AND computational unit 1200 receives a first and second match line $mlo_1$ and $mlo_{i+1}$.

In operation, the AND gate 1302 receives the second match line $mlo_{i+1}$ and the match line enable output 1108. The output of the AND gate 1302 is the second match line result 214. In addition, the OR gate 1304 also receives as inputs the second match line $mlo_{i+1}$ and the match line enable output 1108. The output of the OR gate 1304 is provided as input to the AND gate 1300, which also receives the first match line $mlo_1$. The output of the AND gate 1300 is the first match line result 214.

As above, embodiments of the present invention store wide words in a particular fashion in order to perform wide word searches. Tables 32 and 33 below illustrate exemplary wide word storage configurations for performing wide words searches using serial AND computational units 1200 as described with reference to FIG. 13, in accordance with an embodiment of the present invention. As will be seen below, these examples essentially mirror the above storage configurations, however, in this embodiment the boundary bits are not utilized.

Table 32 below shows unique width tags associated with two double row stored CAM entries.

TABLE 32

| Row | Stored Tag | Stored Data |
|---|---|---|
| 0 | B | DataB1-E |
| 1 | B | DataB2-E |
| 2 | B | DataB1-F |
| 3 | B | DataB2-F |

Table 33 below shows unique width tags associated with a double row and a single row stored CAM entries.

TABLE 33

| Row | Stored Tag | Stored Data |
|---|---|---|
| 0 | B | DataB1-H |
| 1 | B | DataB2-H |
| 2 | A | DataA1-C |

Similar to previously described methods for search wide words, the methods described with reference to FIGS. 11–13 can search in an ascending or descending search fashion, providing the data is searched in the same way that it is stored. However, in the embodiments of FIGS. 11–13, the CAM arrays are modified to search only the relevant rows. That is, each CAM array is modified such that a search is conducted only on particular rows, and the match lines that are connected to rows that are not searched do not change state. Thus far, the serial AND computational units described with respect to FIGS. 11–13 are capable of searching one or two rows. However, it should be noted that embodiments of the present invention can easily be extended to accommodate wide words that are greater than two rows, as will be apparent to those skilled in the art after a careful reading of the present disclosure.

When the serial AND array is capable of one or two row searching, the CAM array includes a means to search only odd rows, a means to search only even rows, and a means to search all rows simultaneously. By odd rows it is meant that the CAM array includes a means to search entries that correspond to match line i where i is an odd integer, and by even rows it is meant that the CAM array includes a means to search entries that correspond to match line i where i is an even integer. To perform these functions, one embodiment of the present invention includes control signals SS[1:0] to control which rows of the CAM array are searched. For example, these control signals can be configured as shown in table 34.

TABLE 34

| Description of CAM Array Operation | SS[1] | SS[0] |
|---|---|---|
| No search | 0 | 0 |
| Search Even Rows only<br>Leave state of odd rows corresponding match line output unchanged | 0 | 1 |
| Search Even Rows only<br>Leave state of odd rows corresponding match line output unchanged | 1 | 0 |
| Search All Rows simultaneously<br>All match lines are updated and may change state | 1 | 1 |

As shown in table 34, the state of the control signals SS[1] and SS[0] indicate which rows are to be searched. In addition, the state of the control signals SS[1] and SS[0] indicate which rows are allowed to change state. For example, when SS[1] is "0" and SS[0] is "1" only even rows are searched. In addition, the match line state of the odd rows remains unchanged.

Using the control signals SS[1:0] in conjunction with the tag bits, match line enable output signal, and priority controller control signal (PEOE), embodiments of the present invention can perform word searches for words spanning multiple rows without using a boundary bit array. Tables 35–37, below, illustrate search signals for performing wide word searches using control signals SS[1:0] and a match line enable output. In particular, table 35, below, illustrates exemplary search signals for performing an ascending search of data spanning two rows.

TABLE 35

| Cycle | Search Data | Search Tag | SS[1:0] | MLE | MLEN | PEOE |
|---|---|---|---|---|---|---|
| 0 | DataB1-H | B | 01 | 0 | 1 | 0 |
| 1 | DataB2-H | B | 10 | 1 | 0 | 1 |

Table 36, below, illustrates exemplary search signals for performing a descending search of data spanning two rows.

TABLE 36

| Cycle | Search Data | Search Tag | SS[1:0] | MLE | MLEN | PEOE |
|---|---|---|---|---|---|---|
| 0 | DataB2-H | B | 10 | 0 | 1 | 0 |
| 1 | DataB1-H | B | 01 | 1 | 0 | 1 |

Finally, table 37, below, illustrates exemplary search signals for performing an ascending or descending search of data spanning a single row.

TABLE 37

| Cycle | Search Data | Search Tag | SS[1:0] | MLE | MLEN | PEOE |
|---|---|---|---|---|---|---|
| 0 | DataA1-C | A | 11 | 0 | 1 | 1 |

In addition to facilitating wide word searching with reduced logic, the capability to search only odd or even rows also greatly reduces the power utilized by the CAM. By only searching half of the CAM array for the first cycle of a two row wide word search, a significant power savings occurs. Similarly, only the other half of the CAM array is searched on the second cycle of a two row wide word search, which achieves similar power savings.

The present invention may be implemented using any type of integrated circuit logic, state machines, or software driven computer-implemented operations. By way of example, a hardware description language (HDL) based design and synthesis program may be used to design the silicon-level circuitry necessary to appropriately perform the data and control operations in accordance with one embodiment of the present invention.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Further, although embodiments of the present invention have been described with specific logical values for various logical statements and states, it should be noted that the embodiments of the present invention are not be limited to these specific logical values for various logical statements and states. In particular, the specific logical values can be changed to better suit a particular design. For example, specified logical values of "0" and "1" can be reversed to better suit the logical design of a particular application.

Additionally, the various block diagrams may be embodied in any form which may include, for example, any suitable computer layout, semiconductor substrate, semiconductor chip or chips, printed circuit boards, packaged integrated circuits, or software implementations (and combinations thereof). Accordingly, those skilled in the art will recognize that the present embodiments are to be considered as illustrative and not restrictive, and the invention is not to be limited to the details given herein, but may be modified within the scope and equivalents of the appended claims.

What is claimed is:

1. A content addressable memory (CAM) capable of performing wide word searches, comprising:
   at least one CAM memory core having a plurality of bit pattern entry rows;
   a boundary array having a plurality word boundary bits, each word boundary bit corresponding to a bit pattern entry row; and
   a serial AND array in communication with the bit pattern entry rows and the word boundary bits, wherein the serial AND array is capable of utilizing the word boundary bits to compute a match result for wide word entries that span multiple bit pattern entry rows.

2. A CAM as recited in claim 1, wherein specific word boundary bits indicate word boundaries of stored word entries.

3. A CAM as recited in claim 2, wherein word boundary bits having a value of "1" indicate a beginning of a new word entry.

4. A CAM as recited in claim 1, wherein the serial AND array includes a plurality of serial AND computational units.

5. A CAM as recited in claim 4, wherein each serial AND computational unit is in electrical communication with a bit pattern entry row and word boundary bit corresponding to the bit pattern entry row.

6. A CAM as recited in claim 5, wherein each serial AND computational unit receives a match line from the corresponding bit pattern entry row and a word boundary bit from the boundary array as input signals.

7. A CAM as recited in claim 6, further including a plurality of CAM memory cores serially coupled.

8. A CAM as recited in claim 7, wherein the CAM is capable of storing word entries spanning multiple CAM memory cores.

9. A content addressable memory (CAM) capable of performing wide word searches, comprising:
   a boundary array having a plurality word boundary bits, each word boundary bit corresponding to a bit pattern entry row of a CAM memory core; and
   a serial AND array having a plurality of serial AND computational units, each serial AND computational unit in communication with a corresponding bit pattern entry row of the CAM memory core and a word boundary bit corresponding to the bit pattern entry row, wherein serial AND computational units receive as inputs a word boundary bit and an internal match line result corresponding to an adjacent bit pattern entry row,
   wherein the serial AND array is capable of utilizing the word boundary bits to compute a match result for wide word entries that span multiple bit pattern entry rows.

10. A CAM as recited in claim 9, wherein specific word boundary bits indicate word boundaries of stored word entries.

11. A CAM as recited in claim 10, wherein word boundary bits having a value of "1" indicate a beginning of a new word entry.

12. A CAM as recited in claim 11, wherein each serial AND computational unit is capable of outputting a "1" only when the corresponding word boundary bit is a "1."

13. A CAM as recited in claim 12, wherein the internal match line result for a particular serial AND computational unit is a match line result before processing the word boundary bit corresponding the serial AND computational unit.

14. A CAM as recited in claim 9, wherein a bit pattern entry row having a lowest priority of the bit pattern entry rows comprising a word entry is searched before remaining bit pattern entry rows of the word entry.

15. A CAM as recited in claim 14, wherein a bit pattern entry row having a highest priority of the bit pattern entry rows comprising the word entry is searched after other bit pattern entry rows of the word entry.

16. A content addressable memory (CAM) capable of performing wide word searches, comprising:
   a boundary array having a plurality word boundary bits, each word boundary bit corresponding to a bit pattern entry row of a CAM memory core; and
   a serial AND array having a plurality of serial AND computational units, each serial AND computational unit in communication with a corresponding bit pattern entry row of the CAM memory core and a word boundary bit corresponding to the bit pattern entry row, wherein serial AND computational units receive as inputs a control signal indicating a beginning of a search and a control signal indicating an end of a search,
   wherein the serial AND array is capable of utilizing the word boundary bits to compute a match result for wide word entries that span multiple bit pattern entry rows.

17. A CAM as recited in claim 16, wherein serial AND computational units further receive as an input a match result from an adjacent serial AND computational unit.

18. A CAM as recited in claim 17, wherein specific word boundary bits indicate word boundaries of stored word entries.

19. A CAM as recited in claim 18, wherein word boundary bits having a value of "1" indicate a beginning of a word entry spanning multiple bit pattern entry rows.

20. A CAM as recited in claim 16, further including a plurality of CAM memory cores serially coupled, wherein the CAM is capable of storing word entries spanning multiple CAM memory cores.

21. A content addressable memory (CAM) capable of performing wide word searches, comprising:
   at least one CAM memory core having a plurality of bit pattern entry rows;

search logic capable searching particular rows during each cycle, the search logic further capable of allowing match line results of unsearched rows to remain unchanged during a cycle; and a serial AND array in communication with the bit pattern entry rows, wherein the serial AND array is capable of computing a match result for wide word entries that span multiple bit pattern entry rows.

22. A CAM as recited in claim 21, further comprising a match line enable signal that is provided to the serial AND array, the match line enable signal facilitating computation of the match result.

23. A CAM as recited in claim 22, wherein the serial AND array includes a plurality of serial AND computational units.

24. A CAM as recited in claim 23, wherein each serial AND computational unit is in electrical communication with a bit pattern entry row and the match line enable signal.

25. A CAM as recited in claim 24, wherein each serial AND computational unit receives a match line from the corresponding bit pattern entry row and the match line enable signal.

26. A CAM as recited in claim 25, further including a plurality of CAM memory cores serially coupled.

27. A CAM as recited in claim 26, wherein the CAM is capable of storing word entries spanning multiple CAM memory cores.

* * * * *